United States Patent
Isohata

(10) Patent No.: US 9,444,466 B2
(45) Date of Patent: Sep. 13, 2016

(54) METHOD OF ADJUSTING FREQUENCY OF RESONATION DEVICE AND METHOD OF MANUFACTURING RESONATION DEVICE

(71) Applicant: SEIKO EPSON CORPORATION, Tokyo (JP)

(72) Inventor: Kensaku Isohata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/658,706

(22) Filed: Mar. 16, 2015

(65) Prior Publication Data

US 2015/0280719 A1    Oct. 1, 2015

(30) Foreign Application Priority Data

Mar. 27, 2014 (JP) ................. 2014-065395

(51) Int. Cl.
*H03L 1/02* (2006.01)
*H03B 1/02* (2006.01)

(52) U.S. Cl.
CPC ............. *H03L 1/028* (2013.01); *H03B 1/02* (2013.01); *H03L 1/022* (2013.01); *Y10T 29/4913* (2015.01)

(58) Field of Classification Search
USPC .......................................... 331/66, 176, 158
See application file for complete search history.

(56) References Cited

U.S. PATENT DOCUMENTS

| | | |
|---|---|---|
| 5,446,954 A | 9/1995 | Knecht et al. |
| 7,872,537 B2 | 1/2011 | Tanaka |
| 8,384,486 B2 | 2/2013 | Nishio |
| 8,760,231 B2 | 6/2014 | Shimodaira |
| 2011/0074515 A1 | 3/2011 | Yoshida |
| 2012/0223622 A1 | 9/2012 | Otsuki |
| 2013/0162360 A1 | 6/2013 | Nishio |
| 2013/0221801 A1 | 8/2013 | Shimodaira |

FOREIGN PATENT DOCUMENTS

| | | |
|---|---|---|
| EP | 2 228 903 A1 | 9/2010 |
| JP | H09-503361 A | 3/1997 |
| JP | 2006-129417 A | 5/2006 |
| JP | 2007-180701 A | 7/2007 |
| JP | 2007-324880 A | 12/2007 |
| JP | 2007-336321 A | 12/2007 |
| JP | 2008-091970 A | 4/2008 |
| JP | 2008-259004 A | 10/2008 |
| JP | 2008-312265 A | 12/2008 |
| JP | 2009-038823 A | 2/2009 |
| JP | 2009-044753 A | 2/2009 |
| JP | 2009-065334 A | 3/2009 |
| JP | 2009-159001 A | 7/2009 |
| JP | 2009-225093 A | 10/2009 |
| JP | 2009-239475 A | 10/2009 |
| JP | 2009-246648 A | 10/2009 |
| JP | 2010-166346 A | 7/2010 |
| JP | 2010-213280 A | 9/2010 |
| JP | 2011-097553 A | 5/2011 |
| JP | 2012-182765 A | 9/2012 |
| JP | 2013-009419 A | 1/2013 |
| JP | 2013-059119 A | 3/2013 |

*Primary Examiner* — Joseph Chang
(74) *Attorney, Agent, or Firm* — Oliff PLC

(57) ABSTRACT

A method of adjusting a frequency of a resonation device including a resonator element and a heating element includes performing the frequency adjustment of the resonator element while heating the resonator element by the heating element.

14 Claims, 4 Drawing Sheets

METHOD OF ADJUSTING FREQUENCY OF RESONATION DEVICE AND METHOD OF MANUFACTURING RESONATION DEVICE

BACKGROUND

1. Technical Field

The present invention relates to a method of adjusting a frequency of a resonation device and a method of manufacturing a resonation device.

2. Related Art

As a resonation device which is used in a reference frequency signal source of a communication instrument, a measurement instrument, or the like, a quartz crystal oscillator is known. In general, the quartz crystal oscillator requires a stable output frequency with high accuracy. In the quartz crystal oscillator, for example, a quartz crystal resonator element and a circuit for oscillating the quartz crystal resonator element are arranged in a case, and in order to stabilize the output frequency with high accuracy, it is necessary to perform the frequency adjustment of the quartz crystal resonator element.

For example, JP-A-2008-91970 discloses a method which performs the frequency adjustment of a piezoelectric resonator element (piezoelectric resonator element) arranged on a chip substrate with an IC circuit formed thereon.

JP-T-9-503361 discloses a method which performs the frequency adjustment of a resonator element for use in a temperature-compensated quartz crystal oscillator (TCXO) in a state where a temperature compensation circuit is operated in a normal manner. In the method disclosed in JP-T-9-503361, it is possible to perform the frequency adjustment of the resonator element in a state where the temperature compensation circuit is operated in the same manner as in an actual operation.

As the quartz crystal oscillator, in addition to the above-described examples, an oven controlled quartz crystal oscillator (OCXO) in which extremely high frequency stability is obtained is known. The OCXO generally includes a thermostat oven which is temperature-controlled by a heating element or the like so as to be maintained at a given temperature (for example, 85° C.) higher than a normal temperature (for example, 25° C.), and a quartz crystal resonator element is housed in the thermostat oven. In general, the frequency adjustment of the quartz crystal resonator element is made in a normal temperature atmosphere, or the frequency adjustment is performed in a state where the quartz crystal resonator element is held in the housing at a normal temperature.

However, in case of a resonation device, such as an OCXO, there may be a difference in environment state, for example, a difference in operation state of a circuit of a resonation device during frequency adjustment and in a state where a heating element is being driven (a state where the heating element is operated and the resonation device is used as an oscillator, that is, an actual use state), or a difference in temperature of the quartz crystal resonator element. With this, for example, since there is a difference in frequency of the quartz crystal resonator element during frequency adjustment and in a state where the heating element is being driven, there may be a large difference in frequency, at which frequency-temperature characteristics become a maximum value and a minimum value, between individual OCXOs. For this reason, even if the heating temperature of the heating element is set based on the result of the frequency adjustment of the quartz crystal resonator element such that desired frequency accuracy is obtained, required frequency accuracy may not be obtained.

In this case, for example, although it is necessary to adjust the heating conditions of the heating element for each individual OCXO, when there is large deviation in frequency-temperature characteristics of each individual OCXO, an operation to perform a setting so as to change the heating conditions for each individual OCXO should be performed, and production efficiency may be degraded.

SUMMARY

An advantage of some aspects of the invention is that it provides a method of adjusting a frequency of a resonation device capable of matching the frequency of the resonator element with a frequency required in an actual use state with high accuracy. Another advantage of some aspects of the invention is that it provides a method of manufacturing a resonation device capable of matching the frequency of the resonator element with a frequency required in an actual use state with high accuracy.

The invention can be implemented as the following forms or application examples.

APPLICATION EXAMPLE 1

A method of adjusting a frequency of a resonation device including a resonator element and a heating element according to this application example includes performing the frequency adjustment of the resonator element while heating the resonator element by the heating element.

In the method of adjusting a frequency of a resonation device according to this application example, it is possible to make the temperature of the resonator element during the frequency adjustment equal to the temperature of the resonator element in an actual use state, or to bring the temperature of the resonator element during the frequency adjustment close to the temperature of the resonator element in the actual use state. With this, it is possible to reduce the difference between the frequency of the resonator element adjusted by the frequency adjustment and the frequency of the resonator element in the actual use state. Therefore, in the method of adjusting a frequency of a resonation device according to this application example, it is possible to match the frequency of the resonator element with a frequency required in an actual use state with high accuracy. Further, in the method of adjusting a frequency of a resonation device according to this application example, it is not necessary to perform an operation to perform a setting so as to change the heating condition for each of a plurality of resonation devices, and it is possible to achieve high production efficiency.

APPLICATION EXAMPLE 2

In the method of adjusting a frequency of a resonation device according to the application example described above, the resonator element may be arranged on the heating element.

In the method of adjusting a frequency of a resonation device according to this application example, since it is possible to heat the resonator element by the heating element efficiently (in a short time), it is possible to control the temperature of the resonator element with higher accuracy.

APPLICATION EXAMPLE 3

In the method of adjusting a frequency of a resonation device according to the application example described above, a thermosensitive element may be provided, and the frequency adjustment of the resonator element may be performed while controlling the temperature of the heating element based on a temperature detection result of the thermosensitive element.

In the method of adjusting a frequency of a resonation device according to this application example, since it is possible to measure the temperature of the heating element and thus to control the temperature of the heating element with high accuracy, it is possible to control the temperature of the resonator element with high accuracy.

APPLICATION EXAMPLE 4

In the method of adjusting a frequency of a resonation device according to the application example described above, the frequency adjustment of the resonator element may be performed in an atmosphere of a pressure lower than an atmospheric pressure.

In the method of adjusting a frequency of a resonation device according to this application example, since the frequency adjustment of the resonator element is performed in the atmosphere of the actual use state, it is possible to reduce the difference between the frequency of the resonator element adjusted by the frequency adjustment and the frequency of the resonator element in the actual use state.

APPLICATION EXAMPLE 5

In the method of adjusting a frequency of a resonation device according to the application example described above, the resonation device may include a substrate on which the resonator element and the heating element are mounted.

In the method of adjusting a frequency of a resonation device according to this application example, since the heating element and the resonator element are mounted on the substrate, for example, in the package, it is possible to further make the temperature of the resonator element during the frequency adjustment equal to the temperature of the resonator element in the actual use state, or to bring the temperature of the resonator element during the frequency adjustment close to the temperature of the resonator element in the actual use state. With this, it is possible to reduce the difference between the frequency of the resonator element adjusted by the frequency adjustment and the frequency of the resonator element in the actual use state. Therefore, in the method of adjusting a frequency of a resonation device according to this application example, it is possible to match the frequency of the resonator element with a frequency required in an actual use state with high accuracy.

APPLICATION EXAMPLE 6

In the method of adjusting a frequency of a resonation device according to the application example described above, the resonation device may further include an oscillation circuit for oscillating the resonator element, and the oscillation circuit may be arranged on the substrate away from the heating element and the frequency adjustment of the resonator element may be performed while operating the oscillation circuit to oscillate the resonator element.

In the method of adjusting a frequency of a resonation device according to this application example, it is possible to suppress an increase in temperature of the electronic element by the heating element. This form is particularly effective when an increase in temperature of the electronic element should be avoided.

APPLICATION EXAMPLE 7

In the method of adjusting a frequency of a resonation device according to the application example described above, the oscillation circuit is covered with the resonator element in plan view.

In the method of adjusting a frequency of a resonation device according to this application example, for example, when the frequency adjustment of the resonator element is performed by etching an excitation electrode provided on the resonator element with laser or ion beams, it is possible to reduce the possibility that the electronic element is irradiated with laser or ion beams and performance is deteriorated.

APPLICATION EXAMPLE 8

In the method of adjusting a frequency of a resonation device according to the application example described above, the frequency adjustment of the resonator element may be further performed while heating the resonator element by heat from the outside of the resonation device.

In the method of adjusting a frequency of a resonation device according to this application example, since the temperature of the resonator element is controlled by both of heating by the heating element and heating from the outside of the resonation device, it is possible to more reliably heat the temperature of the resonator element.

APPLICATION EXAMPLE 9

A method of manufacturing a resonation device including a resonator element, a heating element, and a substrate, on which the resonator element and the heating element are mounted, according to this application example includes mounting the resonator element and the heating element on the substrate, and performing the frequency adjustment of the resonator element in a state where the heating element generates heat and the temperature of the resonator element is controlled.

In the method of manufacturing a resonation device according to this application example, it is possible to make the temperature of the resonator element during the frequency adjustment equal to the temperature of the resonator element in an actual use state, or to bring the temperature of the resonator element during the frequency adjustment close to the temperature of the resonator element in the actual use state. With this, it is possible to reduce the difference between the frequency of the resonator element adjusted by the frequency adjustment and the frequency of the resonator element in the actual use state. Therefore, in the method of manufacturing a resonation device according to this application example, it is possible to match the frequency of the resonator element with a frequency required in an actual use state with high accuracy. Furthermore, in the method of manufacturing a resonation device according to this application example, it is not necessary to perform an operation to perform a setting so as to change the heating condition for each of a plurality of resonation devices, and it is possible to achieve high production efficiency.

APPLICATION EXAMPLE 10

In the method of manufacturing a resonation device according to the application example described above, the frequency adjustment of the resonator element may be further performed while heating the resonator element by heat from the outside of the resonation device.

In the method of manufacturing a resonation device according to this application example, since the temperature of the resonator element is controlled by both of heating by the heating element and heating from the outside of the resonation device, it is possible to more reliably control the temperature of the resonator element through heating.

APPLICATION EXAMPLE 11

In the method of manufacturing a resonation device according to the application example described above, the frequency adjustment of the resonator element may be performed in an atmosphere of a pressure lower than an atmospheric pressure.

In the method of manufacturing a resonation device according to this application example, since the frequency adjustment of the resonator element is performed in the atmosphere of the actual use state, it is possible to reduce the difference between the frequency of the resonator element adjusted by the frequency adjustment and the frequency of the resonator element in the actual use state.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
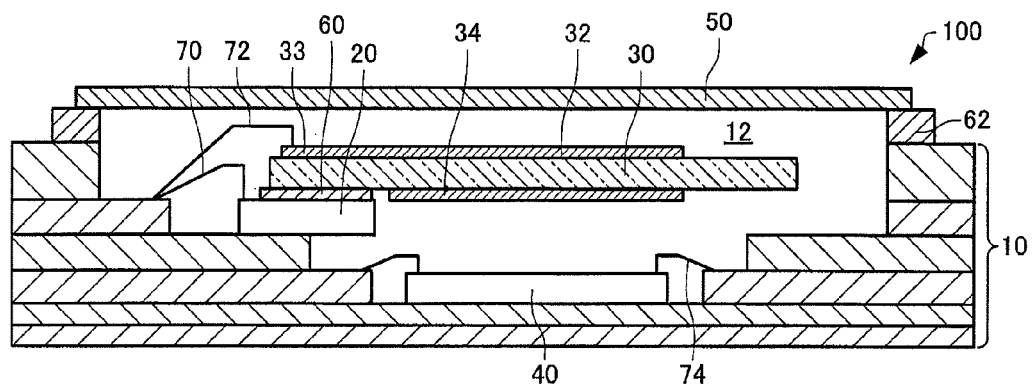
FIG. 1 is a sectional view schematically showing a resonation device according to this embodiment.

Hereinafter, exemplary embodiments of the invention will be described in detail referring to the drawings. The embodiments described below are not intended to unduly limit the content of the invention described in the appended claims. Besides, all of configurations described below are not necessarily indispensable requirements of the invention.

Hereinafter, although an oven controlled quartz crystal oscillator (OCXO) will be described as an example of a resonation device according to an embodiment of the invention, the resonation device according to the embodiment of the invention may be various devices including a heating element and a resonator element, for example, an oscillator other than the OCXO, or a sensor which detects a physical quantity, such as an inertial sensor (acceleration sensor, gyro sensor, or the like) or a force sensor (tilt sensor or the like).

1. Resonation Device

Figure 2:
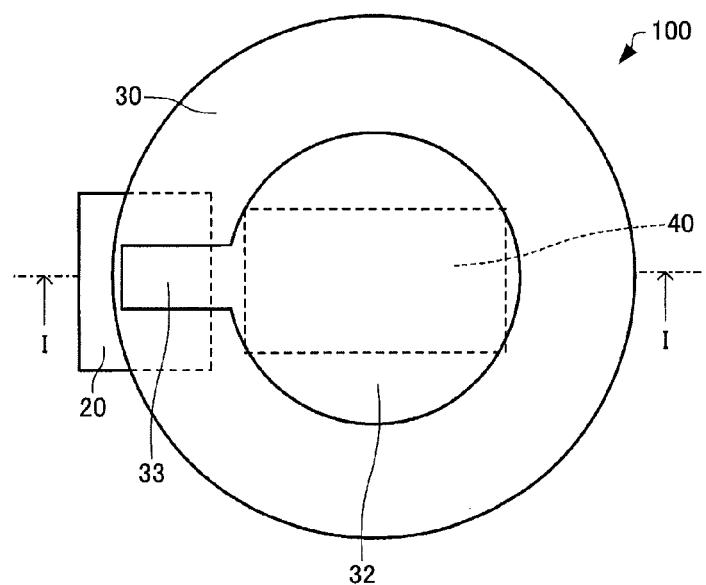
FIG. 2 is a plan view schematically showing the resonation device according to this embodiment.

First, a resonation device according to this embodiment will be described referring to the drawings. FIG. 1 is a sectional view schematically showing a resonation device 100 according to this embodiment. FIG. 2 is a plan view schematically showing the resonation device 100 according to this embodiment. FIG. 1 is a sectional view taken along the line I-I of FIG. 2.

As shown in FIGS. 1 and 2, the resonation device 100 includes a substrate 10, a heating element 20, a resonator element 30, a first excitation electrode 32, a second excitation electrode 34, an electronic element (oscillation IC) 40, and a lid 50. For convenience, in FIG. 2, the substrate 10 and the lid 50 are omitted.

The substrate 10 is, for example, a ceramic package. In the example of the drawing, the substrate 10 is a ceramic laminate package which is formed by molding and laminating a ceramic green sheet and performing baking. The substrate 10 is constituted by, for example, six layers.

The substrate 10 has a concave portion, and the heating element 20, the resonator element 30, and the electronic element 40 are housed in a space (housing chamber) 12 inside the concave portion. In the example of the drawing, an opening is provided in the upper portion of the substrate 10, and the housing chamber 12 is formed by covering the opening with the lid 50. The housing chamber 12 is, for example, in a low pressure atmosphere. With this, it is possible to suppress attenuation of the resonance phenomenon of the resonator element 30 due to gas viscosity. The low pressure atmosphere refers to the state of a space filled with gas having a pressure (equal to or less than $1\times10^5$ Pa to $1\times10^{-10}$ Pa (JIS Z 8126-1: 1999)) lower than a normal atmospheric pressure.

The heating element 20 is arranged (mounted) on the substrate 10. In the example of the drawing, the heating element 20 is fixed to the upper surface of a fourth layer of the substrate 10 from below by an adhesive (not shown) or the like. A plurality of pads (not shown) are provided on the upper surface of the heating element 20. Each pad provided on the upper surface of the heating element 20 is electrically connected to each electrode (not shown) provided on the upper surface of a fifth layer of the substrate 10 from below by a wire 70.

The heating element 20 is, for example, a heating IC. The heating IC includes, for example, a heating circuit and a temperature sensor (thermosensitive element). The heating circuit is, for example, a circuit which generates heat when a current flows in a resistor. The heating circuit may be an element which generates heat when power of a power transistor or the like is input. In the resonation device 100, for example, the resonator element 30 is arranged on the heating circuit. The temperature sensor is arranged close to the resonator element 30 and outputs a signal according to temperature (for example, a signal having a voltage according to temperature). The temperature sensor is constituted by, for example, a diode or a thermistor.

The resonator element 30 is arranged (mounted) on the substrate 10. In the example of the drawing, the resonator element 30 is arranged on the heating element 20. That is, the resonator element 30 is arranged on the substrate 10 through the heating element 20. The resonator element 30 is connected onto the heating element 20 through a connection member 60. The connection member 60 is, for example, an adhesive (an adhesive containing polyimide, epoxy, silicon, or the like), a solder material (solder, Ag solder, or the like), a reaction layer, or the like. In the example of FIG. 2, although the planar shape of the resonator element 30 is a circular shape, the planar shape of the resonator element is not particularly limited, and for example, may be a rectangular shape.

Though not shown, the resonator element 30 may be directly connected onto the substrate 10 through a connection member, instead of being connected onto the heating element 20. That is, the resonator element 30 and the heating element 20 may not overlap each other in plan view. In this form, it is possible to achieve reduction in height of the substrate 10.

The resonator element 30 is an element whose output frequency has temperature characteristics. Specifically, the resonator element 30 is a resonator element (quartz crystal resonator) which uses quartz crystal as a substrate material, and for example, an SC cut or AT cut quartz crystal resonator is used. As this quartz crystal resonator, for example, a mesa quartz crystal resonator where a central portion is thicker than a peripheral portion and the central portion (thick portion) becomes a resonation portion may be used. However, the resonator element 30 may be a surface acoustic wave (SAW) resonator or a micro electro mechanical systems (MEMS) resonator. As the substrate material of the resonator element 30, in addition to quartz crystal, piezoelectric single crystal, such as lithium tantalate or lithium niobate, a piezoelectric material, such as piezoelectric ceramics of lead zirconate titanate or the like, a silicon semiconductor material, or the like may be used. A unit configured to excite the resonator element 30 may use a piezoelectric effect, or electrostatic driving using Coulomb force.

The first excitation electrode 32 is provided on the upper surface of the resonator element 30. In the example of FIG. 2, the planar shape of the first excitation electrode 32 is a circle. The first excitation electrode 32 is connected to a pad 33. The second excitation electrode 34 is provided on the lower surface of the resonator element 30. The planar shape of the second excitation electrode 34 is, for example, the same as the planar shape of the first excitation electrode 32. The second excitation electrode 34 is connected to a pad (not shown). The excitation electrodes 32 and 34 are provided with the resonator element 30 sandwiched therebetween. As the excitation electrodes 32 and 34 and the pad 33, for example, an electrode in which chromium and gold are laminated from the resonator element 30 side in this order is used. The excitation electrodes 32 and 34 are electrodes for causing the resonator element 30 to resonate.

The pad 33 connected to the first excitation electrode 32 is electrically connected to an electrode (a first electrode) on the upper surface of the fifth layer of the substrate 10 from below by a wire 72. The pad connected to the second excitation electrode 34 is electrically connected to an electrode (a second electrode separated from the first electrode) on the upper surface of the fifth layer of the substrate 10 from below by a wire (not shown).

Though not shown, the pad 33 connected to the first excitation electrode 32 may be provided on the lower surface of the resonator element 30, and the pad 33 connected to the first excitation electrode 32 and the pad connected to the second excitation electrode 34 may be connected to the pads provided on the upper surface of the heating element 20 through the conductive connection member 60.

The electronic element 40 is arranged (mounted) on the substrate 10. The electronic element 40 is connected to the upper surface of the second layer of the substrate 10 from below through an adhesive (not shown) or the like. In the example of the drawing, the electronic element 40 is arranged on the substrate 10 away from the heating element 20. The electronic element 40 has a plurality of pads (not shown) provided on the upper surface of the electronic element 40. Each pad provided on the upper surface of the electronic element 40 is electrically connected to each electrode (not shown) provided on the upper surface of the second layer of the substrate 10 from below by a wire 74.

As shown in FIG. 2, the electronic element 40 is arranged within the outer periphery (outer edge) of the resonator element 30 in plan view, that is, so as to be covered with the resonator element 30. Here, the electronic element 40 being arranged within the outer periphery (outer edge) of the resonator element 30 in plan view includes a case where the outer edge of the electronic element 40 is inside of the outer edge of the resonator element 30 in plan view, a case where a part of the outer edge of the electronic element 40 overlaps a part of the outer edge of the resonator element 30 in plan view and another part of the outer edge of the electronic element 40 is inside of the outer edge of the resonator element 30 in plan view, and a case where the outer edge of the electronic element 40 overlaps the outer edge of the resonator element 30 in plan view and a region inside of the outer edge of the electronic element 40 is inside of the outer edge of the resonator element 30.

The electronic element 40 is, for example, an oscillation IC. The oscillation IC includes, for example, an oscillation circuit and a temperature control circuit.

The oscillation circuit is a circuit which is connected to both ends of the resonator element 30, and amplifies a signal output from the resonator element 30 and feeds back the signal to the resonator element 30, thereby oscillating the resonator element 30. A circuit constituted by the resonator element 30 and the oscillation circuit may be, for example, various oscillation circuits, such as a pierce oscillation circuit, an inverter oscillation circuit, a Colpitts oscillation circuit, and a Hartley oscillation circuit. The electronic element 40 may include an output circuit for amplifying the signal output from the resonator element 30, separately from the oscillation circuit.

The temperature control circuit is a circuit which controls the amount of a current flowing in the resistor of the heating circuit based on an output signal (temperature information) of the temperature sensor and maintains the resonator element 30 at constant temperature. For example, the temperature control circuit performs control such that a desired current flows in the resistor of the heating circuit when the current temperature determined from the output signal of the temperature sensor is lower than a set reference temperature, and a current does not flow in the resistor of the heating circuit when the current temperature is higher than the reference temperature. For example, the temperature control circuit may perform control such that the amount of a current flowing in the resistor of the heating circuit increases or decreases according to the difference between the current temperature and the reference temperature.

The lid 50 covers the opening of the substrate 10. The shape of the lid 50 is, for example, a plate shape. As the lid 50, for example, a metal plate made of the same material as the substrate 10, kovar, 42 alloy, stainless steel, or the like may be used. The lid 50 is bonded to the substrate 10 through a connection member 62, such as a seam ring, low melting point glass, or adhesive.

Though not shown, inside or on the surface of the substrate 10, wirings for electrically connecting the electrode wire-bonded to the pad 33 connected to the first excitation electrode 32, the electrode wire-bonded to the pad connected to the second excitation electrode 34, each electrode wire-bonded to each pad of the heating element 20, and each electrode wire-bonded to each electrode of the electronic element 40 may be provided.

Though not shown, a power supply terminal, a ground terminal, or other external terminals (an output terminal of an oscillation signal, an adjustment terminal or a control terminal of the electronic element 40, an adjustment terminal or a control terminal of the heating element 20, a characteristic monitoring terminal of the resonator element 30, and the like) are provided on the lower surface of the substrate 10, and wirings for electrically connecting the power supply terminal and the ground terminal to the heating element 20 and the electronic element 40 or wirings for electrically connecting other external terminals and the electronic element 40 may be provided inside or on the surface of the substrate 10.

2. method of Manufacturing Resonation Device

Figure 3:
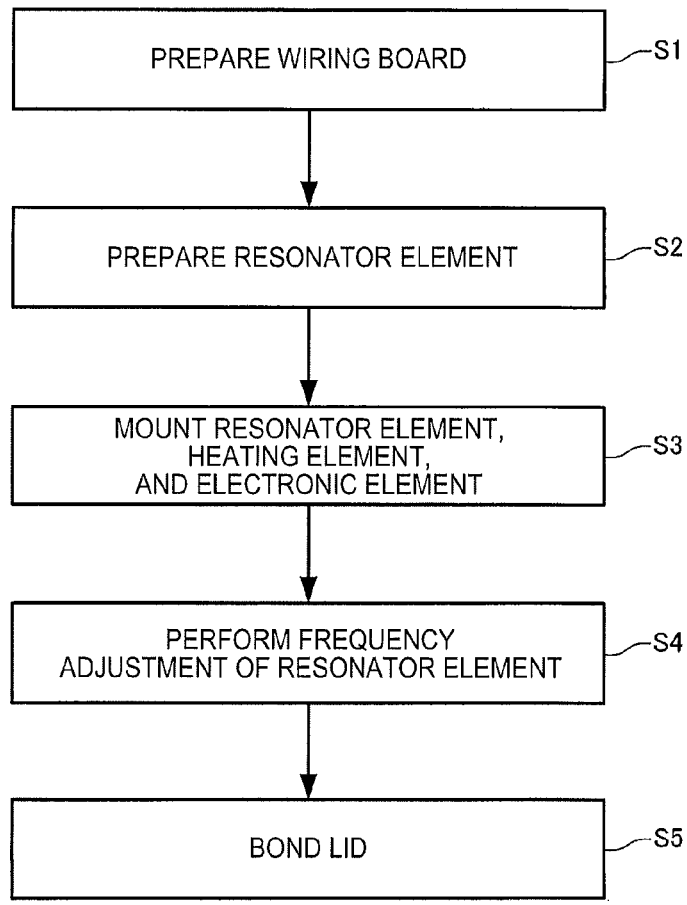
FIG. 3 is a flowchart illustrating a method of manufacturing the resonation device according to this embodiment.
Figure 4:
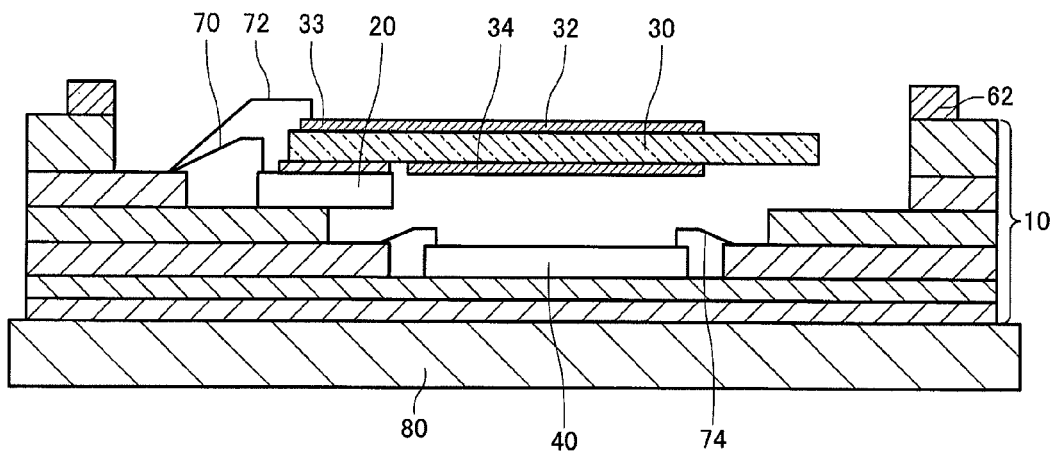
FIG. 4 is a sectional view schematically showing a manufacturing process of the resonation device according to this embodiment.

Next, a method of manufacturing the resonation device 100 according to this embodiment (a frequency adjustment method of the resonation device 100) will be described referring to the drawings. FIG. 3 is a flowchart illustrating a method of manufacturing the resonation device 100 according to this embodiment. FIG. 4 is a sectional view schematically showing a manufacturing process of the resonation device 100 according to this embodiment, and corresponds to FIG. 1.

First, the substrate 10 is prepared (S1). The substrate 10 is formed, for example, by molding and laminating a ceramic green sheet and performing baking.

Next, the resonator element 30 is prepared (S2). The resonator element 30 is formed, for example, by patterning a quartz crystal substrate (not shown) (patterning by photolithography and etching). Next, the excitation electrodes 32 and 34 are formed on the resonator element 30. The excitation electrodes 32 and 34 are formed, for example, by forming a conductive layer (not shown) on the resonator element 30 and patterning the conductive layer. The forming of the conductive layer is performed by, for example, a sputtering method, a vapor deposition method, plating, or the like. With this, it is possible to form the resonator element 30 provided with the excitation electrodes 32 and 34.

The order of the process (S1) for preparing the substrate 10 and the process (S2) for preparing the resonator element 30 provided with the excitation electrodes 32 and 34 is not particularly limited.

Next, as shown in FIG. 1, the resonator element 30 provided with the excitation electrodes 32 and 34, the heating element 20, and the electronic element 40 are arranged (mounted) on the substrate 10 (S3). Specifically, the electronic element 40 is connected to the substrate 10 by an adhesive, and each pad provided on the upper surface of the electronic element 40 is electrically connected to each electrode provided on the upper surface of the third layer of the substrate 10 from below by the wire 74. Next, the heating element 20 is connected to the substrate 10 by an adhesive, and the resonator element 30 is connected onto the heating element 20 by the connection member 60. Next, each pad provided on the upper surface of the heating element 20 is electrically connected to each electrode provided on the upper surface of the fifth layer of the substrate 10 from below by the wire 70. The pad 33 connected to the first excitation electrode 32 is electrically connected to the electrode (first electrode) provided on the upper surface of the fifth layer of the substrate 10 from below by the wire 72. The pad connected to the second excitation electrode 34 is electrically connected to the electrode (second electrode) provided on the upper surface of the fifth layer of the substrate 10 from below by the wire (not shown).

Next, the frequency adjustment of the resonator element 30 is performed in a state where the heating element 20 generates heat and the temperature of the resonator element 30 is controlled (S4). Specifically, first, a voltage is applied to the power supply terminal provided on the lower surface of the substrate 10 to operate (to make) the heating element 20 (generate heat), thereby setting the temperature of the resonator element 30, for example, to be equal to the temperature of the resonator element 30 in an actual use state. Specifically, the heating element 20 is operated (generates heat), thereby setting the temperature of the resonator element 30 to about 85° C. Here, the actual use state refers to, for example, a state where the resonation device 100 is mounted in an electronic apparatus 1000 or a moving object 1100 described below, the heating element 20 is operated (generates heat), and the resonation device 100 is used as an oscillator.

In the process (S4) for performing the frequency adjustment of the resonator element 30 (the frequency adjustment of the resonator element 30), the frequency adjustment may be further performed while heating the resonator element 30 by heat from the outside of the resonation device 100. That is, the substrate 10 may be heated from the outside of the resonation device 100. Specifically, as shown in FIG. 4, the substrate 10 with the resonator element 30 arranged (mounted) thereon is arranged on a stage 80, and the stage 80 is heated, thereby heating the resonator element 30. The material of the stage 80 is, for example, a metal.

Next, the frequency of the resonator element 30 is adjusted. The frequency adjustment of the resonator element 30 is performed in a state where the temperature of the resonator element 30 is controlled. That is, in the frequency adjustment method of the resonation device 100, the frequency adjustment of the resonator element 30 is performed while controlling the temperature of the resonator element 30 through heating by the heating element 20. In the frequency adjustment of the resonator element 30, for example, the electronic element 40 is operated to oscillate the resonator element 30, a result is viewed while monitoring the frequency of the oscillation signal of the resonator element 30 (the signal output from the resonator element 30), and the first excitation electrode 32 is etched with laser or ion beams. As an example, in the frequency adjustment method of the resonation device 100, the first excitation electrode 32 is etched such that the frequency of the resonator element 30 becomes a maximum value or a minimum value of frequency-temperature characteristics. The frequency adjustment of the resonator element 30 may be performed by adding mass to the resonator element 30 (for example, adding a metal, such as gold, to the resonator element 30 using vapor deposition, sputtering, spraying, coating, or the like). The frequency adjustment of the resonator element 30 may be performed while monitoring the characteristics of the resonator element 30 without operating the electronic element 40. When supplying power to the electronic element 40, or when monitoring the frequency of the oscillation signal of the resonator element 30 or the characteristics of the resonator element 30, though not shown, the power supply terminal, the ground terminal, or other external terminals provided on the lower surface of the substrate 10 may be used, though not shown, wirings provided inside or on the surface of the substrate 10 may be used, or a probe or the like may be brought into contact with the electronic element 40 or the resonator element 30.

In the process (S4) for performing the frequency adjustment of the resonator element 30 (in the frequency adjustment of the resonator element 30), for example, the frequency adjustment of the resonator element 30 is performed while operating the oscillation circuit to oscillate the resonator element 30.

In the process (S4) for performing the frequency adjustment of the resonator element 30 (in the frequency adjustment of the resonator element 30), for example, the heating element 20 includes a thermosensitive element, and the frequency adjustment of the resonator element 30 is performed while controlling the temperature of the heating element 20 based on a temperature detection result of the thermosensitive element. For example, the heating element 20 receives a signal output from the thermosensitive element and generates heats such that the temperature of the thermosensitive element becomes a set temperature.

The process (S4) for adjusting the frequency of the resonator element 30 is performed, for example, in an atmosphere of a pressure lower than an atmospheric pressure. That is, the frequency adjustment of the resonator element 30 is performed in an atmosphere of a pressure lower than an atmospheric pressure. Specifically, the substrate 10 with the resonator element 30 and the like arranged thereon is arranged in the case (not shown), and the frequency adjustment of the resonator element 30 is performed in a state where the case is in an atmosphere of a pressure lower than an atmospheric pressure.

Next, the lid 50 is bonded to the substrate 10 by the connection member 62 (S5). This process is performed in an atmosphere of a pressure lower than an atmospheric pressure, whereby the housing chamber 12 in which the resonator element 30 and the like are housed can be in an atmosphere of a pressure lower than an atmospheric pressure. The process (S4) for performing the frequency adjustment of the resonator element 30 may be performed after this process. In this case, the lid 50 is made of a transparent material to laser or ion beams. The process for bonding the lid 50 to the substrate 10 by the connection member 62 is not limited to an atmosphere of a pressure lower than an atmospheric pressure, and may be performed in an inert gas atmosphere, such as nitrogen, argon, or helium.

With the above, it is possible to manufacture the resonation device 100.

Though not shown, the resonation device 100 may not include the electronic element 40. In this case, for example, it is possible to perform the frequency adjustment using a network analyzer.

The method of manufacturing the resonation device 100 has, for example, the following features.

The method of manufacturing the resonation device 100 includes a process for mounting the resonator element 30 and the heating element 20 on the substrate 10, and a process for performing the frequency adjustment of the resonator element 30 in a state where the heating element 20 generates heat and the temperature of the resonator element 30 is controlled. That is, in the resonation device 100, the frequency adjustment of the resonator element 30 is performed while heating the resonator element 30 by the heating element 20. For this reason, in the method of manufacturing the resonation device 100 (frequency adjustment method), it is possible to make the temperature of the resonator element 30 during the frequency adjustment equal to the temperature of the resonator element 30 in the actual use state, or to bring the temperature of the resonator element 30 during the frequency adjustment close to the temperature of the resonator element 30 in the actual use state. With this, it is possible to reduce the difference between the frequency of the resonator element 30 adjusted by the frequency adjustment and the frequency of the resonator element 30 in the actual use state. Therefore, in the method of manufacturing the resonation device 100, it is possible to match the frequency of the resonator element 30 with a frequency required in the actual use state with high accuracy. As a result, it is possible to make the output frequency of the resonation device 100 high accuracy. In the method of manufacturing the resonation device 100, it is not necessary to perform an operation to perform a setting so as to change the heating condition for each of a plurality of resonation devices 100, and it is possible to achieve high production efficiency.

In the method of manufacturing the resonation device 100 (frequency adjustment method), the resonator element 30 is arranged on the heating element 20. For this reason, in the method of manufacturing the resonation device 100, since it is possible to heat the resonator element 30 by the heating element 20 efficiently (in a short time), it is possible to control the temperature of the resonator element 30 with higher accuracy.

In the method of manufacturing the resonation device 100 (frequency adjustment method), the heating element 20 includes the temperature sensor (thermosensitive element), and the frequency adjustment of the resonator element 30 is performed while controlling the temperature of the heating element 20 based on the temperature detection result of the thermosensitive element. For this reason, in the method of manufacturing the resonation device 100, since it is possible to measure the temperature of the heating element 20 with high accuracy and thus to control the temperature of the heating element 20 with high accuracy, it is possible to control the temperature of the resonator element 30 with high accuracy.

In the method of manufacturing the resonation device 100 (frequency adjustment method), the frequency adjustment of the resonator element 30 is performed in an atmosphere of a pressure lower than an atmospheric pressure. In this way, in the method of manufacturing the resonation device 100, since the frequency adjustment of the resonator element 30 is performed in the atmosphere of the actual use state, it is possible to reduce the difference between the frequency of the resonator element 30 adjusted by the frequency adjustment and the frequency of the resonator element 30 in the actual use state.

In the method of manufacturing the resonation device 100 (frequency adjustment method), the resonation device 100 includes the substrate 10 on which the resonator element 30 and the heating element 20 are mounted. For this reason, in the method of manufacturing the resonation device 100, since the heating element 20 and the resonator element 30 are arranged on the substrate 10, for example, in the package, it is possible to further make the temperature of the resonator element 30 during the frequency adjustment equal to the temperature of the resonator element in the actual use state, or to bring the temperature of the resonator element 30 during the frequency adjustment close to the temperature of the resonator element 30 in the actual use state. With this, it is possible to reduce the difference between the frequency of the resonator element 30 adjusted by the frequency adjustment and the frequency of the resonator element 30 in the actual use state. Therefore, in the method of manufacturing the resonation device 100, it is possible to match the frequency of the resonator element 30 with a frequency required in the actual use state.

In the method of manufacturing the resonation device 100 (frequency adjustment method), the electronic element 40 including the oscillation circuit is arranged on the substrate away from the heating element 20, and the frequency adjustment of the resonator element 30 is performed while operating the oscillation circuit to oscillate the resonator element 30. For this reason, in the method of manufacturing the resonation device 100, it is possible to suppress an increase in temperature of the electronic element 40 by the heating element 20. This form is particularly effective when an increase in temperature of the electronic element 40 should be avoided.

In the method of manufacturing the resonation device 100 (frequency adjustment method), the electronic element 40 including the oscillation circuit is covered with the resonator element 30 in plan view. For this reason, for example, when the frequency adjustment of the resonator element 30 is performed by etching the first excitation electrode 32 with laser or ion beams, it is possible to reduce the possibility that the electronic element 40 is irradiated with laser or ion beams and performance is deteriorated.

In the method of manufacturing the resonation device 100 (frequency adjustment method), the frequency adjustment of the resonator element 30 is performed while heating the resonator element 30 by heat from the outside of the resonation device 100. For this reason, in the method of manufacturing the resonation device 100, since the temperature of the resonator element 30 is controlled by both of heating by the heating element 20 and heating from the outside of the resonation device 100, it is possible to more reliably control the temperature of the resonator element 30 through heating.

3. Modification Examples of Resonation Device 3.1. First Modification Example

Figure 5:
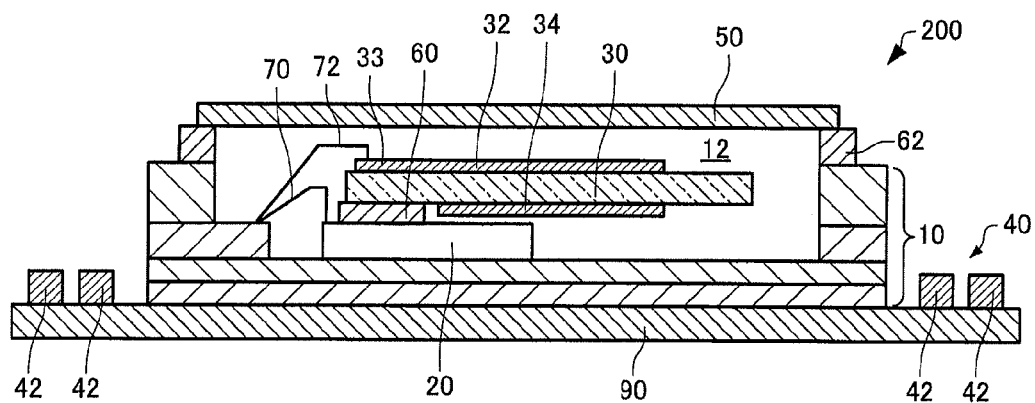
FIG. 5 is a sectional view schematically showing a resonation device according to a first modification example of this embodiment.

Next, a resonation device according to a first modification example of this embodiment will be described referring to the drawings. FIG. 5 is a sectional view schematically showing a resonation device 200 according to the first modification example of this embodiment, and corresponds to FIG. 1.

Hereinafter, in the resonation device 200 according to the first modification example of this embodiment, the members having the same functions as the members of the resonation device 100 according to this embodiment described above are represented by the same reference numerals, and detailed description will not be repeated. The same applies to a resonation device according to a second modification example of this embodiment.

In the above-described resonation device 100, as shown in FIG. 1, the electronic element 40 is housed in the housing chamber 12. In contrast, in the resonation device 200, as shown in FIG. 5, the electronic element 40 is arranged outside the housing chamber 12. That is, the electronic element 40 is not housed in the housing chamber 12.

The resonation device 200 includes a support substrate 90. The support substrate 90 is, for example, a printed board. The substrate 10 is provided on the support substrate 90. On the support substrate 90, an electronic component 42 which constitutes the oscillation circuit of the electronic element 40 is provided. In the example of the drawing, the electronic component 42 is provided away from the substrate 10. The electronic component 42 is, for example, a resistor, a capacitor, a transistor, or the like constituting the oscillation circuit. The substrate 10 of the resonation device 200 is constituted by four layers.

In the resonation device 200, since the electronic element 40 is arranged outside the housing chamber 12, it is possible to achieve reduction in height of the substrate 10.

3.2. Second Modification Example

Figure 6:
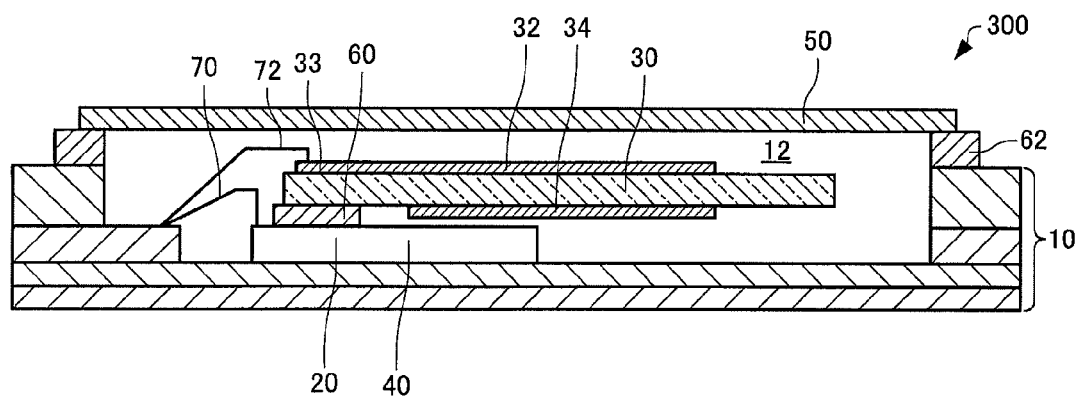
FIG. 6 is a sectional view schematically showing a resonation device according to a second modification example of this embodiment.

Next, a resonation device according to a second modification example of this embodiment will be described referring to the drawings. FIG. 6 is a sectional view schematically showing a resonation device 300 according to the second modification example of this embodiment, and corresponds to FIG. 1.

In the above-described resonation device 100, as shown in FIG. 1, the heating element 20 and the electronic element 40 are arranged away from each other. In contrast, in the resonation device 300, as shown in FIG. 6, the heating element 20 and the electronic element 40 are provided integrally. Specifically, the heating element 20 and the electronic element 40 are provided on a single circuit board (printed board, semiconductor integrated circuit board, such as silicon, or the like). The substrate 10 of the resonation device 300 is constituted by four layers.

In the resonation device 300, since the heating element 20 and the electronic element 40 are provided integrally, it is possible to efficiently control the temperature of the electronic element 40 by the heating element 20. Therefore, in the resonation device 300, for example, it is possible to make the temperature of the electronic element 40 during the frequency adjustment equal to the temperature of the electronic element 40 in the actual use state. With this, it is possible to suppress the occurrence of the difference between the frequency of the resonator element 30 adjusted by the frequency adjustment and the frequency of the resonator element 30 in the actual use state due to the temperature of the electronic element 40.

In the resonation device 300, since the heating element 20 and the electronic element 40 are provided integrally, it is possible to achieve further reduction in height of the substrate 10.

4. Electronic Apparatus

Figure 7:
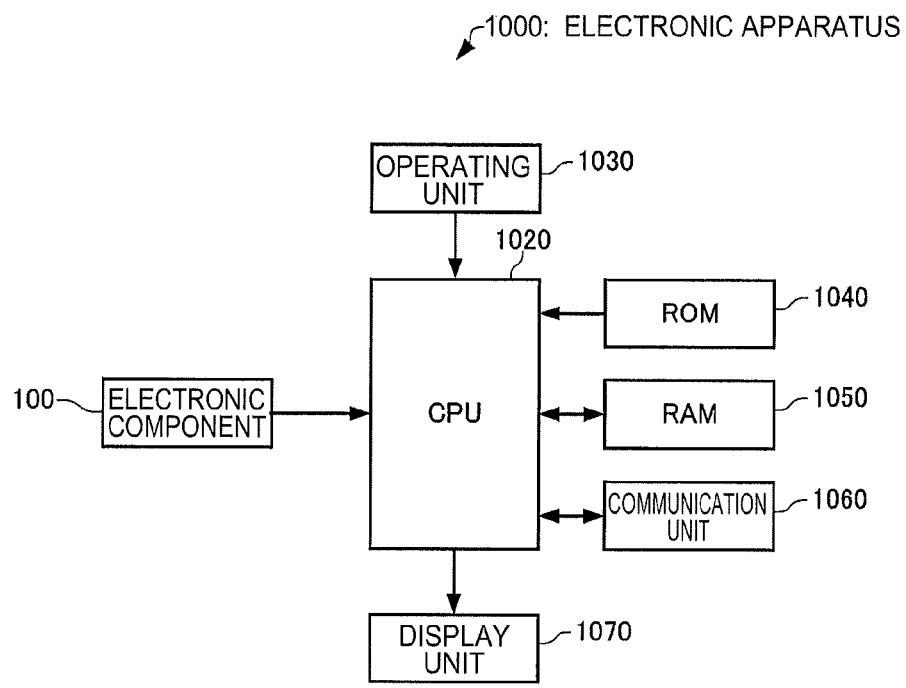
FIG. 7 is a functional block diagram of an electronic apparatus according to this embodiment.

Next, an electronic apparatus according to this embodiment will be described referring to the drawings. FIG. 7 is a functional block diagram of the electronic apparatus of this embodiment.

An electronic apparatus 1000 includes a resonation device according to an embodiment of the invention. Here, as shown in FIG. 7, a case where the resonation device 100 is used as a resonation device according to an embodiment of the invention will be described.

The electronic apparatus 1000 further includes a central processing unit (CPU) 1020, an operating unit 1030, a read only memory (ROM) 1040, a random access memory (RAM) 1050, a communication unit 1060, and a display unit 1070. In the electronic apparatus of this embodiment, a part of the components (respective units) of FIG. 7 may be omitted or modified, or other components may be added.

Though not shown, the resonation device 100 includes a resonator element and a heating element, and generates an oscillation signal based on the oscillation of the resonator element heated by the heating element. The oscillation signal is output to the CPU 1020.

The CPU 1020 performs various kinds of computation processing or control processing based on the oscillation signal input from the resonation device 100 according to a program stored in the ROM 1040 or the like. In addition, the CPU 1020 performs various kinds of processing according to an operation signal from the operating unit 1030, processing for controlling the communication unit 1060 in order to perform data communication with an external device, processing for transmitting a display signal in order to display various kinds of information on the display unit 1070, and the like.

The operating unit 1030 is an input device which is constituted by operation keys, button switches, or the like, and outputs an operation signal according to a user's operation to the CPU 1020.

The ROM 1040 stores a program, data, and the like for various kinds of computation processing or control processing in the CPU 1020.

The RAM 1050 is used as a work area of the CPU 1020, and temporarily stores the program or data read from the ROM 1040, data input from the operating unit 1030, arithmetic results of the CPU 1020 implemented according to various programs, and the like.

The communication unit 1060 performs various kinds of control in order to establish data communication between the CPU 1020 and the external device.

The display unit 1070 is a display device which is constituted by a liquid crystal display (LCD) or the like, and displays various kinds of information based on the display signal input from the CPU 1020. The display unit 1070 may be provided with a touch panel which functions as the operating unit 1030.

As the electronic apparatus 1000, various electronic apparatuses can be considered, and include, for example, a personal computer (for example, a mobile personal computer, a laptop personal computer, and a tablet personal computer), a mobile terminal, such as a smartphone or a mobile phone, a digital still camera, an ink jet ejection device (for example, an ink jet printer), a storage area network apparatus, such as a router and a switch, a local area network apparatus, an apparatus for a mobile terminal base station, a television set, a video camera, a video recorder, a car navigation system, a real time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (for example, an electronic thermometer, a blood pressure monitor, a blood glucose monitor, an electrocardiograph, ultrasonic diagnostic equipment, and an electronic endoscope), a fish finder, a variety of measuring instruments, gauges (for example, gauges for cars, aircrafts, and boats and ships), a flight simulator, a head-mount display, a motion tracer, a motion tracker, a motion controller, and a pedestrian dead reckoning (PDR) system.

5. Moving Object

Figure 8:
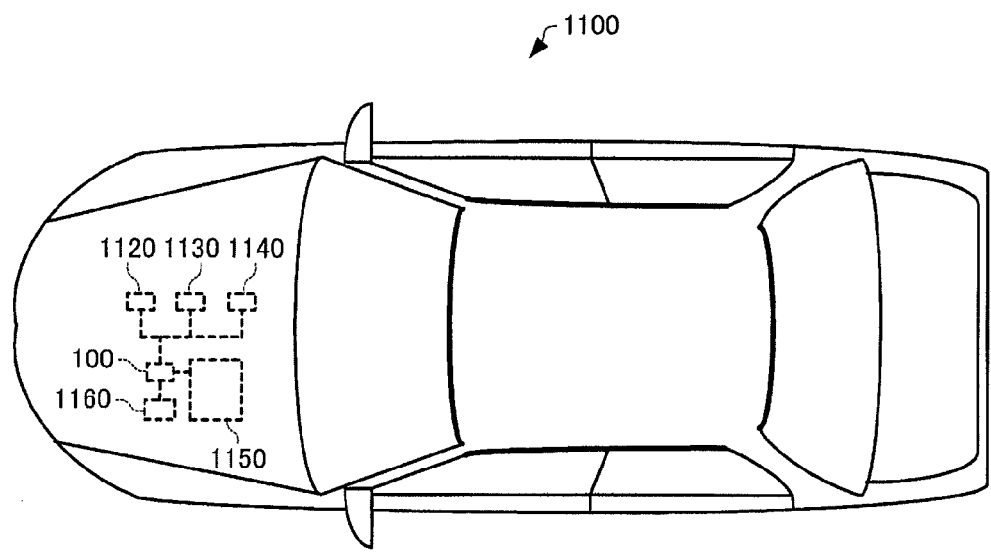
FIG. 8 is a diagram showing an example of a moving object according to this embodiment.

Next, a moving object according to this embodiment will be described referring to the drawings. FIG. 8 is a diagram (top view) showing an example of the moving object of this embodiment.

The moving object 1100 includes a resonation device according to an embodiment of the invention. Here, as shown in FIG. 8, a case where the resonation device 100 is used as a resonation device according to an embodiment of the invention will be described.

The moving object 1100 further includes controllers 1120, 1130, and 1140 which perform various kinds of control of an engine system, a brake system, a keyless entry system, and the like, a battery 1150, and a backup battery 1160. In the moving object of this embodiment, a part of the components (respective units) of FIG. 8 may be omitted or changed, or other components may be added.

Though not shown, the resonation device 100 includes a resonator element and a heating element, and generates an oscillation signal based on the oscillation of the resonator element heated by the heating element. The oscillation signal is output from the resonation device 100 to the controllers 1120, 1130, and 1140.

The battery 1150 supplies power to the resonation device 100 and the controllers 1120, 1130, and 1140. The backup battery 1160 supplies power to the resonation device 100 and the controllers 1120, 1130, and 1140 when the output voltage of the battery 1150 falls below a threshold value.

Various moving objects are considered as the moving object 1100, and for example, an automobile (including an electric automobile), an aircraft, such as a jet plane or a helicopter, a vessel, a rocket, an artificial satellite, and the like are considered.

The embodiments and the modification examples described above are illustrative only, and the invention is not limited thereto. For example, the embodiments and the modification examples described above may be appropriately combined with each other.

The invention includes configurations (for example, configurations having the same function, the same way, and the same result, or configurations having the same object and the same advantages) substantially the same as the configuration described in the embodiments of the invention. Furthermore, the invention includes configurations obtained by replacing a non-essential part of the configuration described in the embodiments of the invention. Furthermore, the invention includes configurations exerting the same functional effects and configurations capable of achieving the same object as the configuration described in the embodiments of the invention. Furthermore, the invention includes configurations obtained by adding technologies known to the public to the configuration described in the embodiments of the invention.

The entire disclosure of Japanese Patent Application No. 2014-065395, filed Mar. 27, 2014 is expressly incorporated by reference herein.

What is claimed is:

1. A method of adjusting a frequency of a resonation device including a resonator element and a heating element, the resonator element having an excitation electrode, the method comprising:
   heating the resonator element with the heating element to a temperature the resonator element will have during a subsequent actual use state; and
   performing the frequency adjustment of the resonator element while heating the resonator element has a temperature at the actual use state, the frequency adjustment being performed by changing a mass of the resonator element.

2. The method of adjusting a frequency of a resonation device according to claim 1,
   wherein the resonator element is arranged on the heating element.

3. The method of adjusting a frequency of a resonation device according to claim 1,
   wherein a thermosensitive element is provided, and the frequency adjustment of the resonator element is performed while controlling the temperature of the heating element based on a temperature detection result of the thermosensitive element.

4. The method of adjusting a frequency of a resonation device according to claim 1,
   wherein the frequency adjustment of the resonator element is performed in an atmosphere of a pressure lower than an atmospheric pressure.

5. The method of adjusting a frequency of a resonation device according to claim 1,
wherein the resonation device includes a substrate on which the resonator element and the heating element are mounted.

6. The method of adjusting a frequency of a resonation device according to claim 1,
wherein the resonation device further includes an oscillation circuit for oscillating the resonator element, and
the oscillation circuit is arranged on the substrate away from the heating element and the frequency adjustment of the resonator element is performed while operating the oscillation circuit to oscillate the resonator element.

7. The method of adjusting a frequency of a resonation device according to claim 6,
wherein the oscillation circuit is covered with the resonator element in plan view.

8. The method of adjusting a frequency of a resonation device according to claim 1,
wherein the frequency adjustment of the resonator element is further performed while heating the resonator element by heat from the outside of the resonation device.

9. A method of manufacturing a resonation device including a resonator element, a heating element, and a substrate, on which the resonator element and the heating element are mounted, the resonator element having an excitation electrode, the method comprising:
mounting the resonator element and the heating element on the substrate; and
performing the frequency adjustment of the resonator element in a state where the heating element generates heat and the temperature of the resonator element is controlled to a temperature the resonator element will have during a subsequent actual use state, the frequency adjustment being performed by changing a mass of the resonator element.

10. The method of manufacturing a resonation device according to claim 9,
wherein the frequency adjustment of the resonator element is further performed while heating the resonator element by heat from the outside of the resonation device.

11. The method of manufacturing a resonation device according to claim 9,
wherein the frequency adjustment of the resonator element is performed in an atmosphere of a pressure lower than an atmospheric pressure.

12. The method of adjusting a frequency of a resonation device according to claim 1, further comprising sealing the resonation device with a lid, the lid being sealed after performing the frequency adjustment of the resonator element while heating the resonator element with the heating element.

13. The method of adjusting a frequency of a resonation device according to claim 1, wherein the resonator element has an excitation electrode, wherein the frequency adjustment of the resonator element is performed by processing the excitation electrode.

14. A method of adjusting a frequency of a resonation device including a resonator element and a heating element, the method comprising:
performing a frequency adjustment of the resonator element while heating the resonator element by the heating element, the frequency adjustment being performed by etching the resonator element.

* * * * *